(12) United States Patent
Zhang et al.

(10) Patent No.: US 11,056,498 B2
(45) Date of Patent: Jul. 6, 2021

(54) SEMICONDUCTOR DEVICE AND MANUFACTURING METHOD THEREFOR

(71) Applicant: Shanghai Huali Microelectronics Corporation, Shanghai (CN)

(72) Inventors: Jinshuang Zhang, Shanghai (CN); Haoyu Chen, Shanghai (CN); Qiwei Wang, Shanghai (CN); Feng Ji, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 16/384,966

(22) Filed: Apr. 16, 2019

(65) Prior Publication Data
US 2020/0006372 A1 Jan. 2, 2020

(30) Foreign Application Priority Data
Jun. 29, 2018 (CN) .......................... 201810714188.4

(51) Int. Cl.
| | | |
|---|---|---|
| H01L 27/11573 | (2017.01) | |
| H01L 21/311 | (2006.01) | |
| H01L 21/762 | (2006.01) | |
| H01L 21/768 | (2006.01) | |
| H01L 27/11565 | (2017.01) | |

(52) U.S. Cl.
CPC .. *H01L 27/11573* (2013.01); *H01L 21/31116* (2013.01); *H01L 21/76224* (2013.01); *H01L 21/76837* (2013.01); *H01L 27/11565* (2013.01)

(58) Field of Classification Search
CPC ......... H01L 21/76837; H01L 21/28238; H01L 2224/82002; H01L 23/3178
See application file for complete search history.

(56) References Cited

U.S. PATENT DOCUMENTS

| | | | | |
|---|---|---|---|---|
| 10,115,825 | B1 * | 10/2018 | Liaw | .................... H01L 29/0653 |
| 2017/0047257 | A1 * | 2/2017 | Han | .................... H01L 27/0886 |

* cited by examiner

*Primary Examiner* — Hsien Ming Lee
(74) *Attorney, Agent, or Firm* — Adsero IP

(57) ABSTRACT

The present disclosure provides a semiconductor device and a manufacturing method therefor. The manufacturing method for a semiconductor device is provided for forming through-holes in a semiconductor device, comprising: forming a plurality of shallow trench isolations in portions of a substrate corresponding to memory cell regions; forming a plurality of gates on surfaces of the portions of the substrate; forming spacers on side walls at both sides of the gates extending in the first direction; depositing a sacrificial layer on the memory cell region; removing portions of the sacrificial layer corresponding to the shallow trench isolations at memory cell drain, and depositing an isolation dielectric on the shallow trench isolations at the memory cell drain to form isolation strips; and removing the remaining sacrificial layer to form bottom through-holes in spaces formed after removing the remaining sacrificial layer.

11 Claims, 13 Drawing Sheets

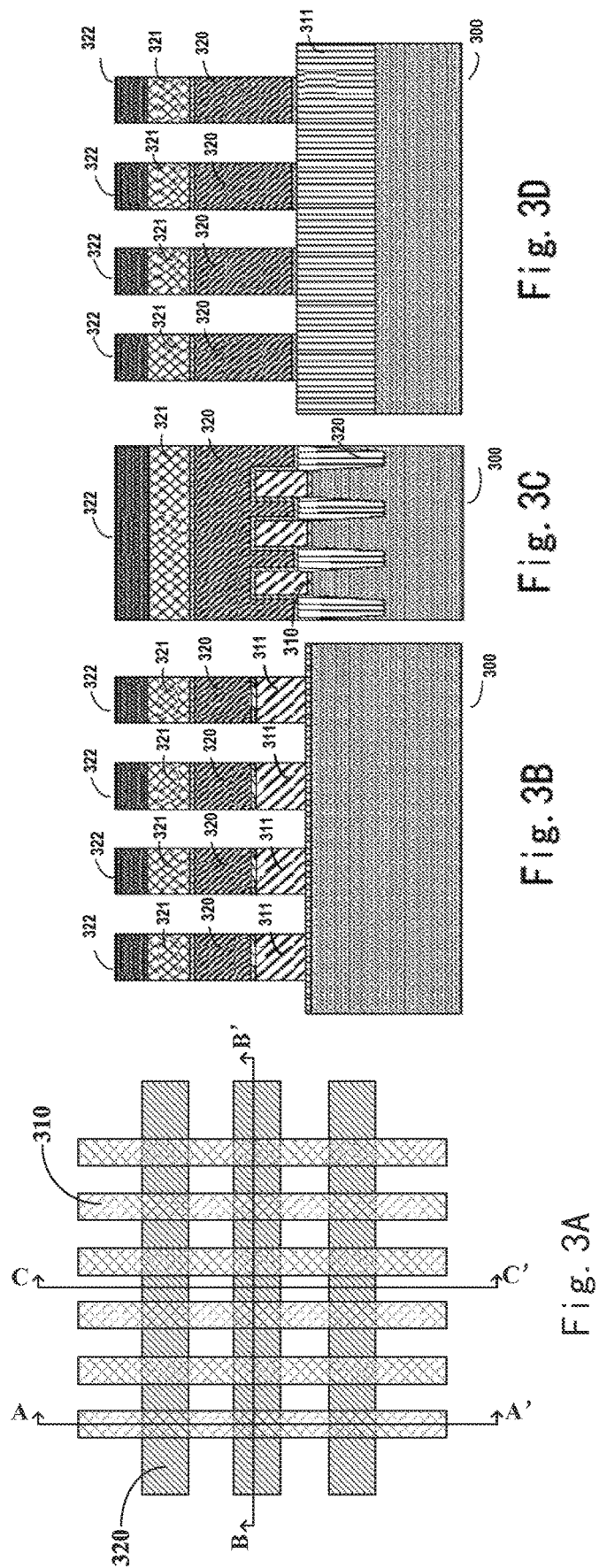

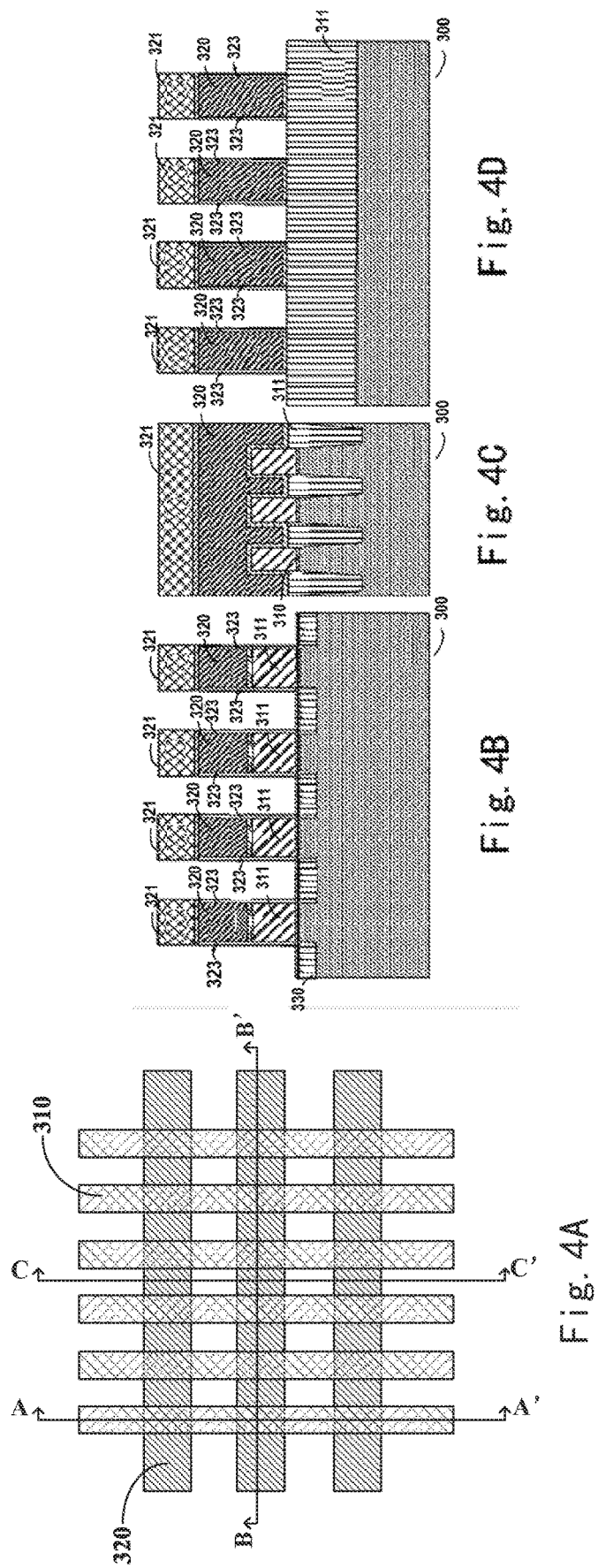

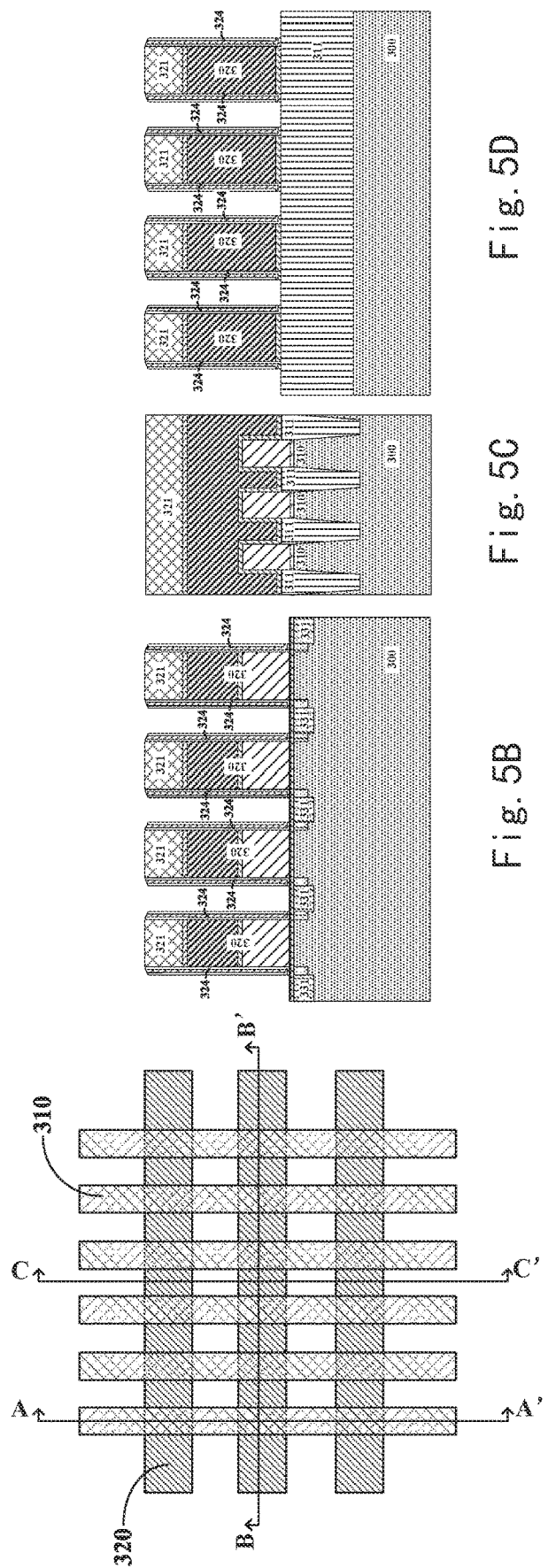

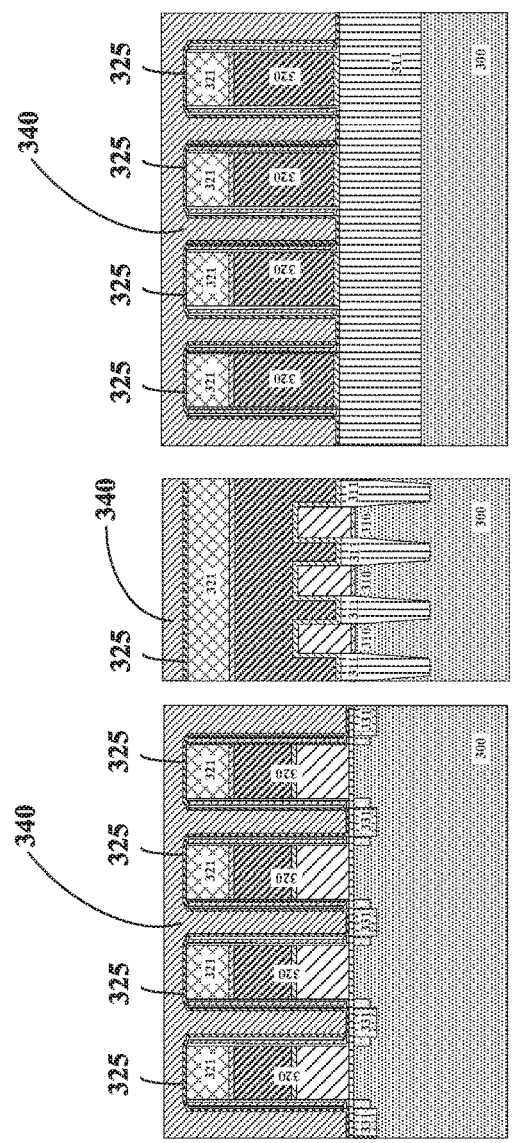
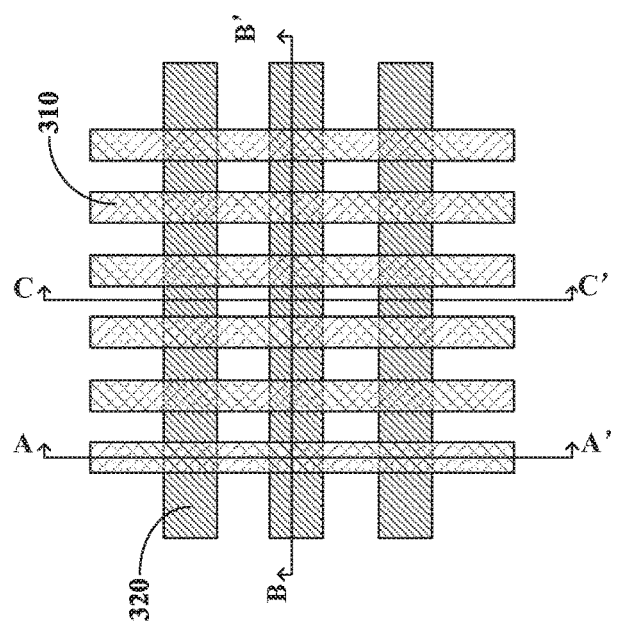
Fig. 6D  Fig. 6C  Fig. 6B  Fig. 6A

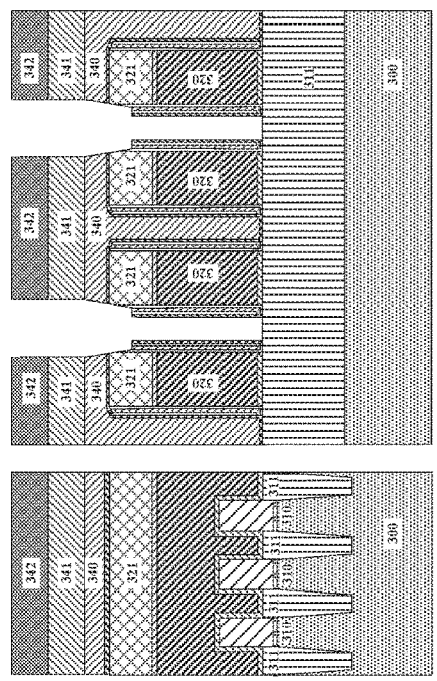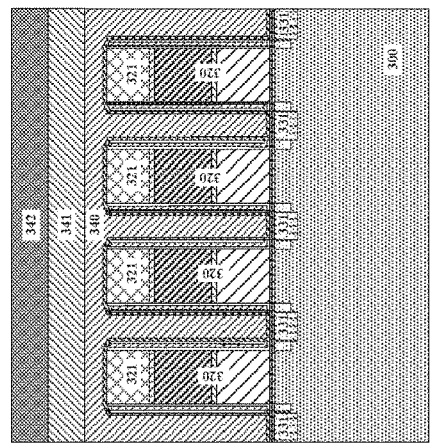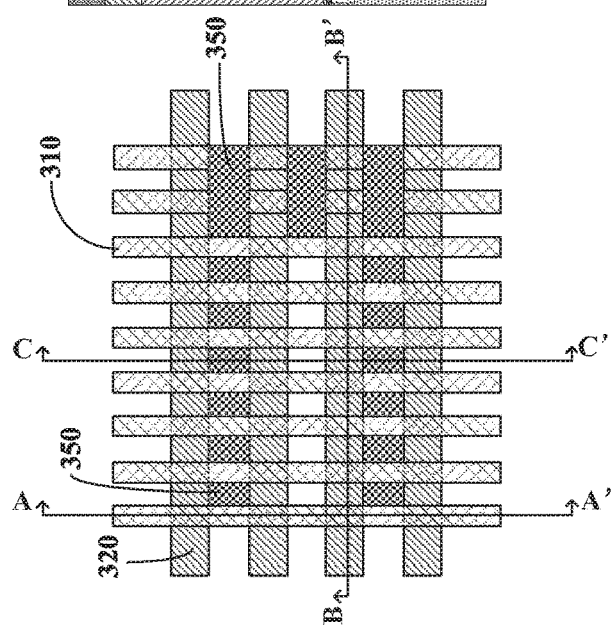
Fig. 7D
Fig. 7C
Fig. 7B
Fig. 7A

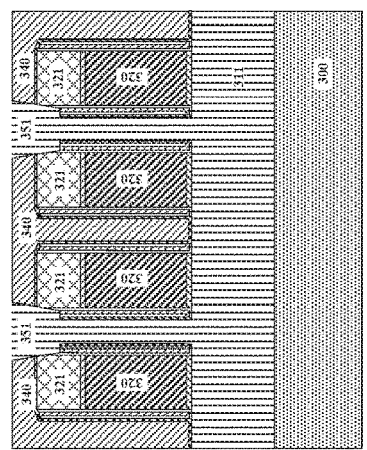
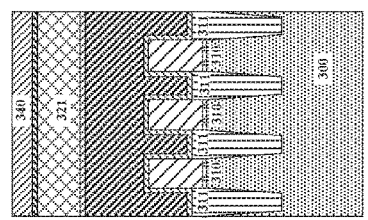
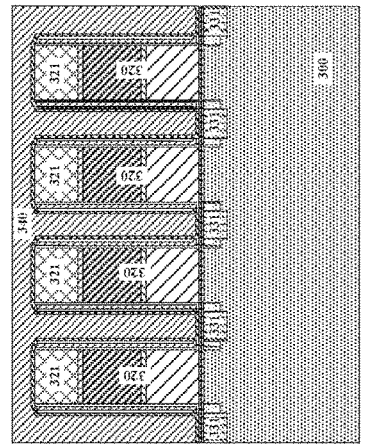
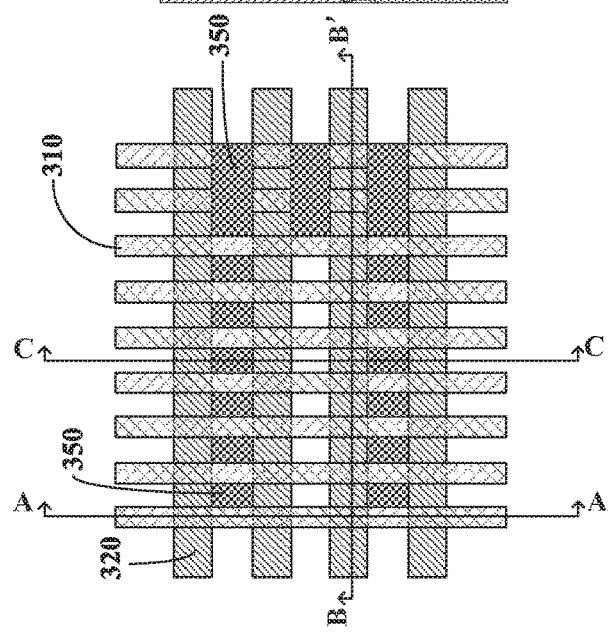
Fig. 8D
Fig. 8C
Fig. 8B
Fig. 8A

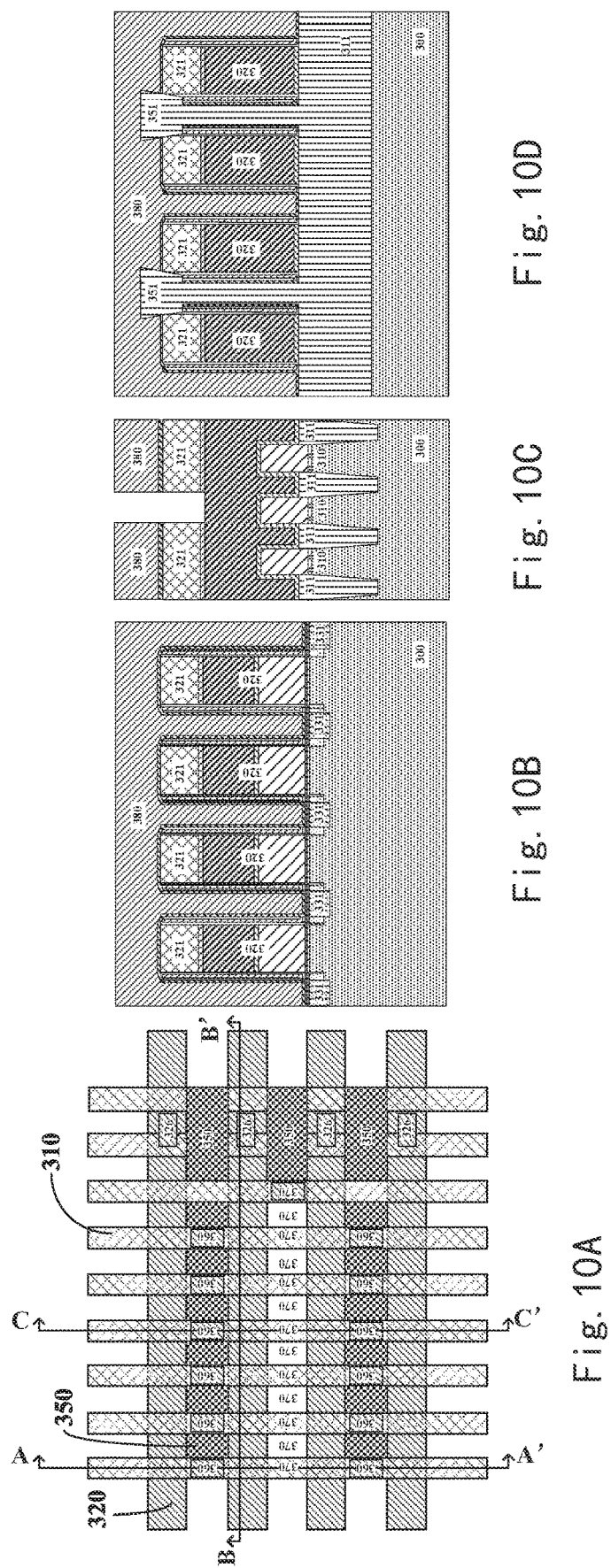

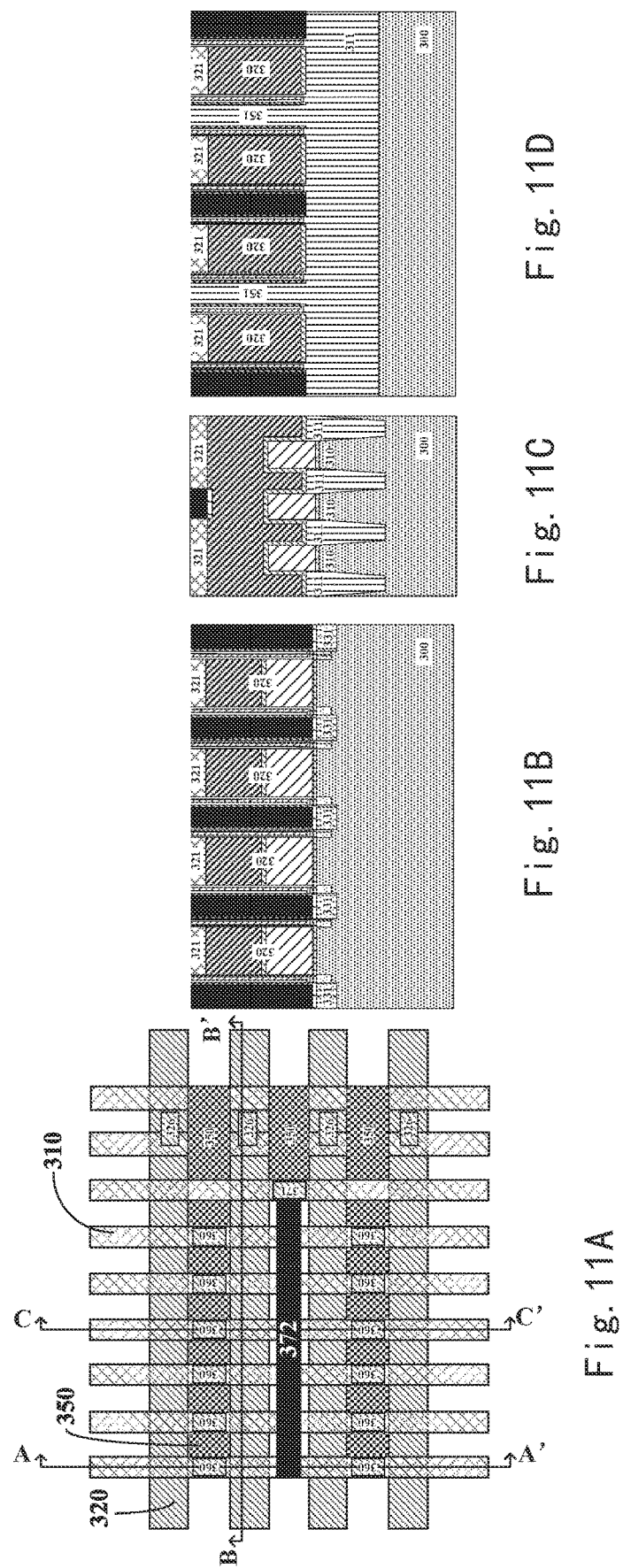

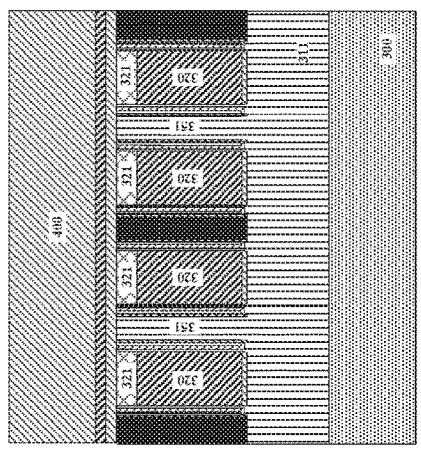
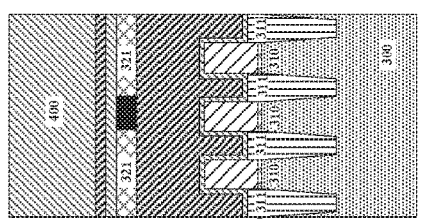
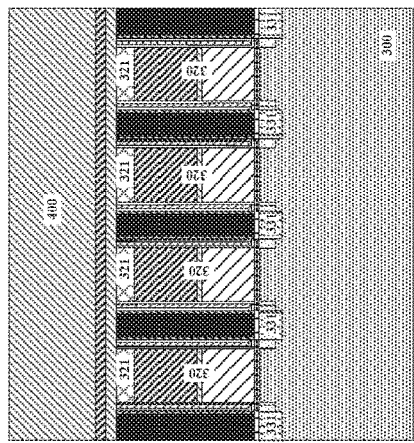
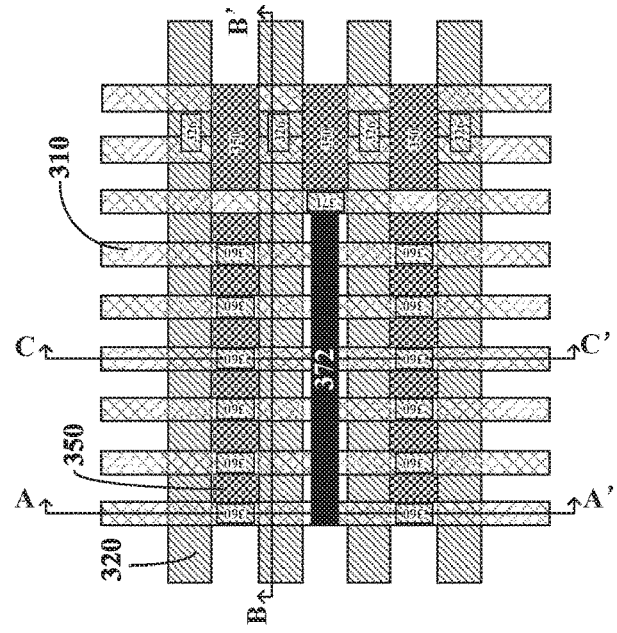
Fig. 12D
Fig. 12C
Fig. 12B
Fig. 12A

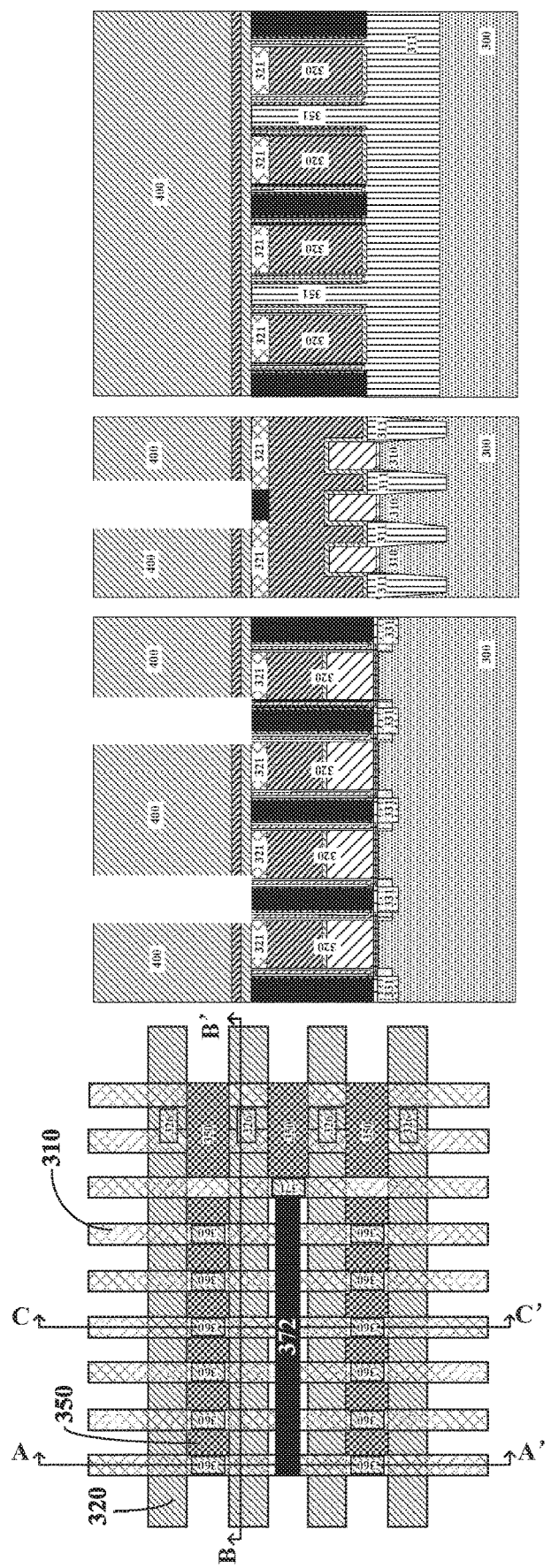

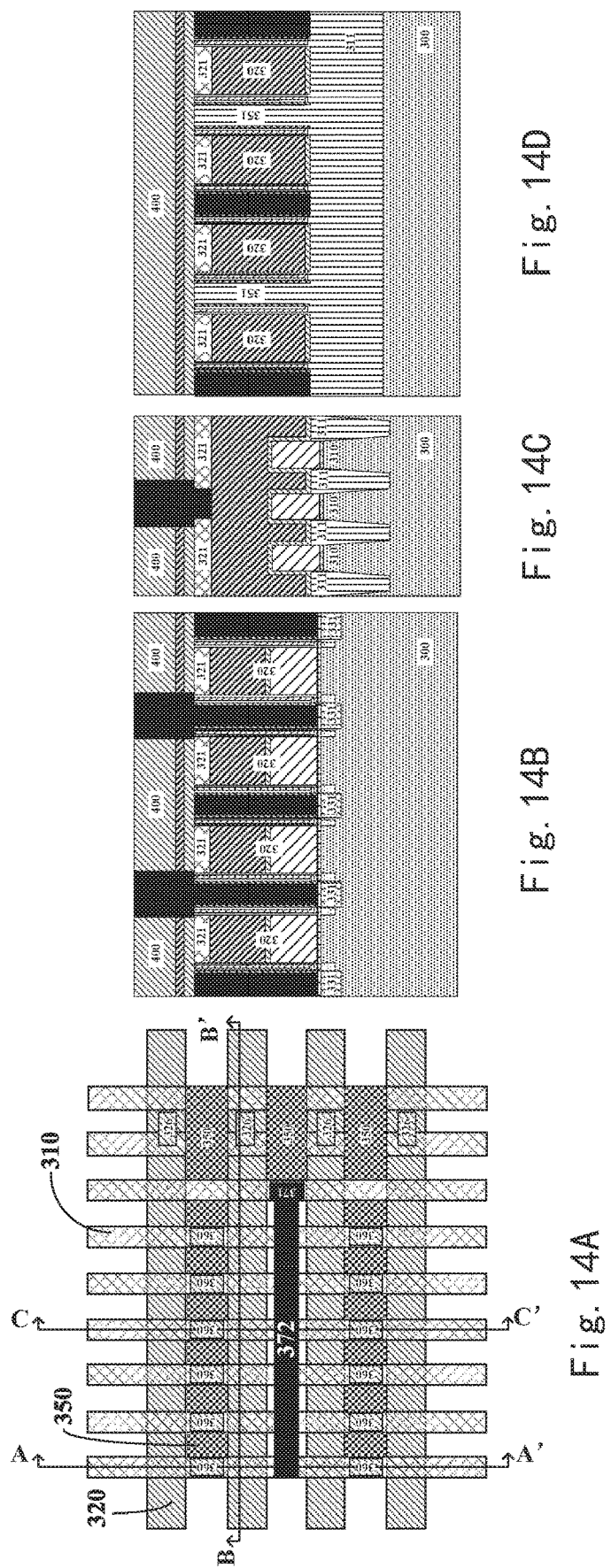

SEMICONDUCTOR DEVICE AND MANUFACTURING METHOD THEREFOR

CROSS-REFERENCES TO RELATED APPLICATIONS

The present application claims priority to Chinese Patent Application No. 201810714188.4, filed on Jun. 29, 2018, entitled "SEMICONDUCTOR DEVICE AND MANUFACTURING METHOD THEREFOR", which is incorporated by reference herein for all purposes.

FIELD

The present disclosure relates to a manufacturing method for a semiconductor device and, in particular to a manufacturing method for a non-volatile memory.

BACKGROUND OF THE DISCLOSURE

Since the disclosure of integrated circuits by Dr. Jack Kilby of Texas Instruments in early years, scientists and engineers have made numerous disclosures and improvements in semiconductor devices and processes. Over 50 years, the size of semiconductors have been significantly reduced, which translates into an increasing processing speed and decreasing power consumption. To date, the development of semiconductors has largely followed Moore's Law, which roughly states that the number of transistors in dense integrated circuits doubles about every two years. This means that the feature size between integrated circuit transistors is shrinking.

For an ETOX-structure non-volatile memory, in order to meet the high-density and high-performance market demands, a node target has gradually moved to less than 50 nm, an AA pitch is gradually reduced to less than 120 nm, and a control gate line width Line is less than 120 nm, however, if the size of a drain between floating gates is required to be small, it will be restricted by the difficulty of the drain through-hole process, and the through-hole OVL and the through-hole shape are both great challenges, which cannot be met by using conventional techniques.

Therefore, there is an urgent need for a novel manufacturing method for a semiconductor device which is applicable to the ETOX-structure non-volatile memory having a node of less than 50 nm so as to overcome the defects of an OVL offset and a non-straight shape of a contact hole.

BRIEF SUMMARY OF THE DISCLOSURE

A brief summary on one or more embodiments is given below to provide the basic understanding for these embodiments. This summary is not an exhaustive overview of all the contemplated embodiments and is neither intended to indicate critical or decisive elements of all embodiments nor to attempt to define the scope of any or all embodiments. Its sole purpose is to present some concepts of one or more embodiments in a simplified form as a preface for a more detailed description presented later.

As stated above, in order to solve the above problem that a through-hole meeting the electrical requirements cannot be formed in the case of the reduced node size, the present disclosure provides a manufacturing method for a semiconductor device configured for forming through-holes in a semiconductor device, and the semiconductor device comprises memory cell regions, the manufacturing method comprising: forming a plurality of shallow trench isolations in portions of a substrate corresponding to the memory cell regions, and the shallow trench isolations are arranged spaced apart from each other in a first direction and extend in a second direction to define active regions of the substrate which are spaced apart by the shallow trench isolations, the first direction being perpendicular to the second direction; forming a plurality of gates on surfaces of the portions of the substrate, and the gates extend in the first direction and are arranged spaced apart from each other in the second direction; forming spacers on side walls at both sides of the gates extending in the first direction; depositing a sacrificial layer on the memory cell region, and the sacrificial layer covers the gates and fills gaps between the gates; removing portions of the sacrificial layer corresponding to the shallow trench isolations at memory cell drain, and depositing an isolation dielectric on the shallow trench isolations at the memory cell drain to form isolation strips; and removing the remaining sacrificial layer to form bottom through-holes in spaces formed after removing the remaining sacrificial layer, and the bottom through-holes comprise drain bottom through-holes of the active regions corresponding to the memory cell drain and source bottom through-holes corresponding to memory cell source, and the material of the sacrificial layer is different from the materials of the spacers, the isolation dielectric, and the shallow trench isolations.

The manufacturing method as described above, In one embodiment, and the gates comprise a control gate layer and a top barrier layer on an upper surface of the control gate layer; and the step of forming the bottom through-holes further comprises: after removing the remaining sacrificial layer, removing portions of the top barrier layer corresponding to gate through-hole regions to form gate bottom through-holes.

The manufacturing method as described above, In one embodiment, and the method for forming the gate bottom through-holes further comprises: depositing photoresist on the memory cell regions; patterning the photoresist to define the gate through-hole regions and exposing the portions of the top barrier layer corresponding to the gate through-hole regions; performing dry etching to remove the portions of the top barrier layer corresponding to the gate through-hole regions to form the gate bottom through-holes; and removing the photoresist.

The manufacturing method as described above, In one embodiment, and the manufacturing method further comprises: forming a top isolation layer on upper surfaces of the gates; and forming top through-holes, which are in communication with the bottom through-holes, in the top isolation layer.

The manufacturing method as described above, In one embodiment, and the step of forming the top through-holes further comprises: depositing photoresist on a surface of the top isolation layer; patterning the photoresist to define top through-hole regions and exposing portions of the top isolation layer corresponding to the top through-hole regions; performing dry etching to remove the portions of the top isolation layer corresponding to the top through-hole regions to form the top through-holes; and removing the photoresist, and the top through-hole regions comprise drain top through-hole regions, source top through-hole regions, and gate top through-hole regions; the drain top through-hole regions correspond to the drain bottom through-holes on a one-to-one basis; the source top through-hole regions correspond to some of the source bottom through-holes in a source line; and the gate top through-hole regions correspond to the gate bottom through-holes on a one-to-one basis.

The manufacturing method as described above, In one embodiment, further comprising before forming the top isolation layer: depositing conductive mediums in the bottom through-holes to form bottom contact holes, and upper surfaces of the bottom contact holes are flush with the upper surfaces of the gates; and the top isolation layer is formed on the upper surfaces of the bottom contact hole and of the gate.

The manufacturing method as described above, In one embodiment, and the manufacturing method further comprises: depositing conductive mediums in the top through-holes to form top contact holes, and the top contact holes are electrically connected to the bottom contact holes.

The manufacturing method as described above, In one embodiment, and the material of the sacrificial layer is one of silicon oxide or silicon nitride.

The manufacturing method as described above, In one embodiment, and the material of the sacrificial layer is silicon nitride, and the material of the spacers, the isolation dielectric, and the shallow trench isolations is silicon oxide.

The manufacturing method as described above, In one embodiment, and the semiconductor device further comprises peripheral circuit regions, and the manufacturing method further comprises: forming MOS transistor devices on portions of the substrate corresponding to the peripheral circuit regions, and forming peripheral circuit through-holes to lead out a source, a drain, and a gate of the MOS transistor device, and the gate bottom through-holes and the peripheral circuit through-holes are simultaneously formed.

The present disclosure further provides a semiconductor device, and the semiconductor device is manufactured using the manufacturing method as described above.

According to the semiconductor device and the manufacturing method therefor provided in the present disclosure, it is possible to form self-aligned through-holes by means of a reverse through-hole process in a case of a reduced node size, so that the through-hole continues to be of the shape of a control gate, and compared with the prior art, the shape of the through-hole is more straight, and the defect of the through-hole OVL offset existing in the prior art is avoided, which effectively reduces the risk of leakage or breakdown from the drain to the control gate, and the performance of electrical characteristics of the semiconductor device is more excellent.

BRIEF DESCRIPTION OF THE DRAWINGS

FIGS. 3A-14D show schematic structural diagrams of a memory formed in the main steps of the manufacturing method provided in the present disclosure.

REFERENCE SIGNS

Figure 1:
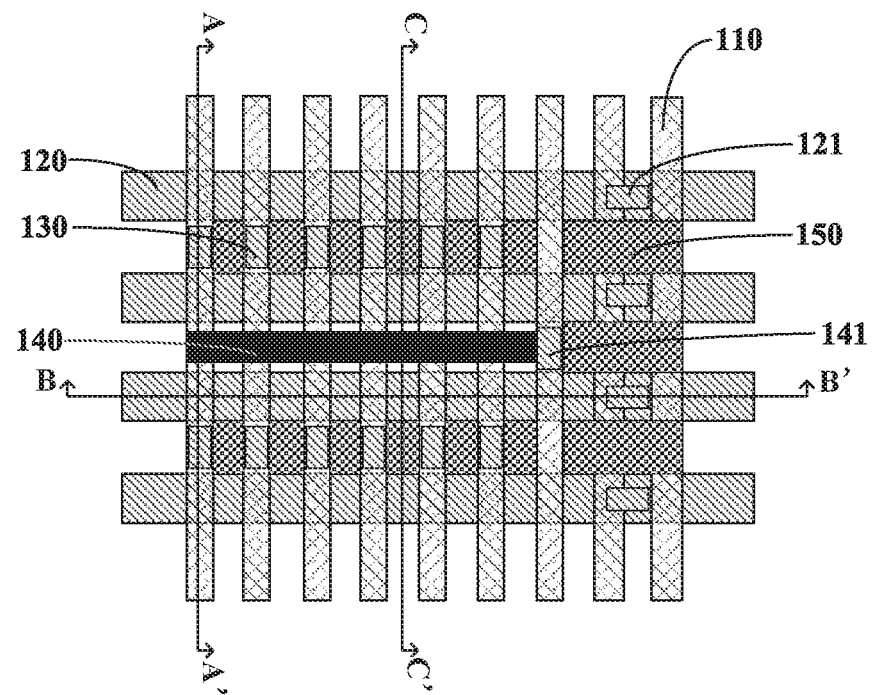
FIG. 1 shows a schematic diagram of the layout of a memory manufactured using the manufacturing method provided in the present disclosure.

Active region 110, 310
Gate 120, 220, 320
Gate through-hole 121
Drain through-hole 130
Source bottom through-hole 140
Source top through-hole 141
Reverse through-hole 150
Substrate 210, 300
Drain 230
Drain bottom contact hole 231
Drain top contact hole 232
Source 240
Source bottom contact hole 241
Shallow trench isolation 311
Top barrier layer 321
Photoresist 322, 342, 380
Spacer isolation layer 324
Second spacer 325
Gate through-hole 326
LDD ion region 330
Sacrificial layer 340
Barrier layer 341
Reverse through-hole 350
Isolation strip 351
Drain through-hole 360
Source through-hole 370
Source top through-hole 371
Source bottom contact hole 372
Top isolation layer 400

DETAILED DESCRIPTION OF THE DISCLOSURE

The present disclosure is described below in detail in conjunction with the accompanying drawings and particular embodiments. It is noted that the embodiments described in conjunction with the accompanying drawings and particular embodiments are merely exemplary, and should not be construed as any limitation on the scope of protection of the present disclosure.

The present disclosure provides a manufacturing method for a semiconductor device. More specifically, an embodiment of the present disclosure provides a manufacturing method for a semiconductor device, and the manufacturing method comprises forming through-holes between semiconductor memories by forming a sacrificial layer between gates, by removing portions of the sacrificial layer to form isolation strips, and then by removing the sacrificial layer. By means of the reverse through-hole process, the through-hole continues to be of the shape of the gate, the shape is more straight, and there is no longitudinal OVL offset, so that the method is applicable to the manufacturing of the ETOX-structure for nodes of 45 nm and below. The present disclosure also provides other embodiments.

Note that when used, the flags left, right, front, back, top, bottom, front, back, clockwise, and counterclockwise are used for convenience purposes only and do not imply any specific fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As stated above, in the process for nodes of 45 nm and below, the formation of contact holes in an ETOX-structure non-volatile memory is restricted by the reduction of the node size and cannot meet the requirements of the straight shape, nor of overcoming the OVL offset. Therefore, the present disclosure provides a manufacturing method for a semiconductor structure, by which a straight through-hole can be formed continuing to be of the shape of the gate by means of the reverse through-hole process, and no OVL offset is present, thereby improving the performance of the memory device.

Figure 2:
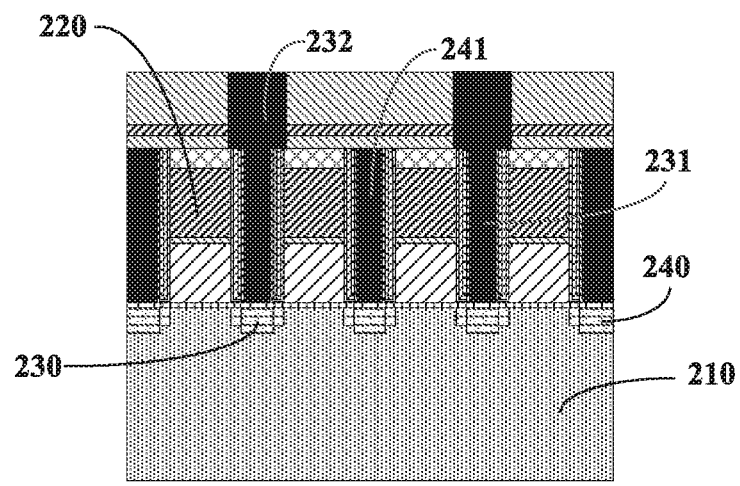
FIG. 2 shows a longitudinal sectional view of source and drain of a memory manufactured using the manufacturing method provided in the present disclosure.

FIG. 1 shows a schematic diagram of the layout of a memory manufactured using the manufacturing method provided in the present disclosure. The manufacturing method provided in the present disclosure is applicable to a manufacturing process for nodes of less than 50 nm, and it ensures that the feature size of the bit line is less than 120 nm, and as shown in FIG. 1, the source and drain of the memory manufactured using the manufacturing method provided in the present disclosure are of a symmetrical source-drain structure, and an interval between the drain can be ensured to be less than 120 nm. FIG. 2 shows a longitudinal sectional view of source and drain of a memory manufactured using the manufacturing method provided in the present disclosure. As shown in FIG. 2, the structure of the memory manufactured using the manufacturing method provided in the present disclosure has a two-layer through-hole structure, comprising: a drain bottom contact hole 231 and a drain top contact hole 232 (corresponding to a drain through-hole 130 in FIG. 1) corresponding to the drain 230, and a source bottom contact hole 241 (corresponding to a source bottom through-hole 140 in FIG. 1) and a source top contact hole (not shown in FIG. 2, and corresponding to a source top through-hole 141 in FIG. 1) corresponding to the source 240. As can be seen from FIG. 2, in the memory device manufactured by means of the manufacturing method provided in the present disclosure, the through-hole continues to be of the shape of the control gate 220, and therefore the through-hole has a straight shape and has better electrical characteristics compared to the prior art.

More specifically, FIGS. 3A-14D will specifically depict schematic diagrams of the layout in the steps of the manufacturing method provided in the present disclosure and sectional views of the memory in different directions.

FIG. 3A shows a design drawing of the layout in which active regions 310 and gates 320 in the memory region substrate have already been defined. Although the active regions 310 of the semiconductor structure are shown in FIG. 3A, the active regions 310 are defined and spaced apart by shallow trench isolations (STI). The gates 320 extend in the first direction and are spaced apart from each other in the second direction, the active regions 310 and the shallow trench isolations spacing the active regions 310 apart extend in the second direction, and the active regions 310 are spaced apart by the shallow trench isolations.

FIG. 3B shows a sectional view of the semiconductor structure in an AA' direction, and in the AA' direction, a schematic diagram of the gates in the active region and in the first direction is shown. As shown in FIG. 3B, the gates 320 are formed on the surface of the substrate 300, and top barrier layers 321 for protecting the above gates 320 as well as photoresist 322 used for etching the above gates 320 are formed on the surfaces of the gates 320.

FIG. 3C shows a sectional view of the semiconductor structure in a BB' direction, and in the BB' direction, a schematic diagram of the gate in the second direction is shown. It can be seen from FIG. 3C that the active regions 310 in the substrate 300 are spaced apart by shallow trench isolations 311 and correspond to storage mediums above the active regions 310 where control gates are formed.

FIG. 3D shows a sectional view of the semiconductor structure in a CC' direction, and in the CC' direction, a schematic diagram of the gates in the shallow trench isolations 311 and in the first direction is shown. As shown in FIG. 3D, the shallow trench isolations 311 are formed in the substrate 300, and the gates 320 on the surfaces of the shallow trench isolations 311 are spaced apart from each other.

After the step of forming the gates 320 described above, the side walls of the gates 320 are oxidized, and LDD lithography and LDD ion implantation are performed on surfaces of the substrate between the gates of the active region. FIGS. 4A-4D show the schematic diagrams of the semiconductor structure after the above steps are executed. FIG. 4A shows a design drawing of the layout in which active regions 310 and gates 320 in the memory region substrate have been defined. FIG. 4B shows a sectional view of the semiconductor structure in an AA' direction, and in the AA' direction, a schematic diagram of the gates in the active regions and in the first direction is shown. As shown in FIG. 4B, the side walls of the gate 320 have thin oxide layers and form LDD ion regions 330 between the gates in the active region. FIG. 4C shows a sectional view of the semiconductor structure in a BB' direction, and in the BB' direction, a schematic diagram of the gates in the second direction is shown. FIG. 4D shows a sectional view of the semiconductor structure in a CC' direction, and in the CC' direction, a schematic diagram of the gates in the shallow trench isolations 311 and in the first direction is shown, with thin oxide layers being provided on the side walls of gates 320. The thin oxide layers on the side walls of the gates 320 function to protect the gates 320 during the LDD lithography and the LDD ion implantation.

After oxidizing the side walls and performing the LDD ion implantation, the method provided in the present disclosure further comprises: forming spacer isolation layers 324 of the gates 320 on the surfaces of the thin oxide layers, and performing source-drain region ion implantation. FIGS. 5A-5D show the schematic diagrams of the semiconductor structure after the above steps are executed. FIG. 5A shows a design drawing of the layout in which the active regions 310 and the gates 320 in the memory region substrate have been defined. FIG. 5B shows a sectional view of the semiconductor structure in an AA' direction, and in the AA' direction, a schematic diagram of the gates in the active regions and in the first direction is shown. As shown in FIG. 5B, the side walls of the gates 320 have spacer isolation layers 324, and source-drain regions 331 are formed in the LDD ion regions 330, respectively. Specifically, the spacer isolation layers 324 use an ONO material, that is, silicon nitride/silicon oxide/silicon nitride. In some embodiments, the material of the above spacer isolation layers 324 may vary as needed, without limitation to the above ONO material, and the thickness of the above spacer isolation layers 324 defines the size of the source-drain regions 331 in the LDD ion regions 330, and may vary according to the electrical characteristics of different memory. FIG. 5C shows a sectional view of the semiconductor structure in a BB' direction, and in the BB' direction, a schematic diagram of the gates in the second direction is shown. FIG. 5D shows a sectional view of the semiconductor structure in a CC' direction, and in the CC' direction, a schematic diagram of the gates in the shallow trench isolations 311 and in the first direction is shown, with spacer isolation layers 324 being provided on the side walls of gates 320.

After the spacer isolation layers 324 are formed and the source-drain regions 331 are formed, the method provided in the present disclosure further comprises: forming second spacers 325 on the surfaces of the spacer isolation layers 324; and depositing sacrificial layers 340 on the memory region. FIGS. 6A-6D show the schematic diagrams of the semiconductor structure after the above steps are executed. FIG. 6A shows a design drawing of the layout in which the active regions 310 and the gates 320 in the memory region substrate have been defined. FIG. 6B shows a sectional view of the semiconductor structure in an AA' direction, and in the AA' direction, a schematic diagram of the gates in the active regions and in the first direction is shown. As shown in FIG. 6B, the second spacers 325 are further formed on the surfaces of the spacer isolation layers and sacrificial layers 340 are deposited on the above memory regions. In one embodiment, in this step, the material of the grown second spacers 325 is silicon oxide, which functions to protect the gates 320 and the spacer isolation layers of the gates 320 when performing wet etching on the memory regions in subsequent steps. The material of the sacrificial layers 340 may be selected to be of silicon nitride and deposited with HARP, followed by ILD CMP. FIG. 6C shows a sectional view of the semiconductor structure in a BB' direction, and in the BB' direction, a schematic diagram of the gates in the second direction is shown. It can be seen from FIG. 6C that the sacrificial layer covers the entire memory region. FIG. 6D shows a sectional view of the semiconductor structure in a CC' direction, and in the CC' direction, a schematic diagram of the gates in the shallow trench isolations 311 and in the first direction is shown, and the second spacers 325 are formed on the surfaces of the spacer isolation layers and the entire memory region is filled with the sacrificial layer 340, and the sacrificial layer 340 fills gaps between the gates.

After the step of depositing the sacrificial layer 340 on the memory region, the method provided in the present disclosure further comprises: removing portions of the sacrificial layer corresponding to the drain of the memory on the shallow trench isolations. FIGS. 7A-7D show the schematic diagrams of the semiconductor structure after the above steps are executed. FIG. 7A shows a design drawing of the layout in which the active regions 310 and the gates 320 in the memory region substrate and reverse through-holes 350 on the shallow trenches of the corresponding drain of the memory have been defined. FIG. 7B shows a sectional view of the semiconductor structure in an AA' direction, and in the AA' direction, a schematic diagram of the gates in the active regions and in the first direction is shown. As shown in FIG. 7B, a barrier layer 341 is deposited first on the surface of the memory region where the sacrificial layer 340 is formed, and the material of the above barrier layer 341 is preferably silicon nitride, and the above deposited barrier layer 341 can protect devices in the subsequent processes, which will be described subsequently. Photoresist 342 is deposited on the surface of the barrier layers 341, and the photoresist 342 is patterned, so that only portions corresponding to the reverse through-holes 350 in FIG. 7A are exposed, and portions of the sacrificial layer 340 at the reverse through-holes are dry etched. In some embodiments, when dry etching is employed, a gas with a high selection ratio of the material of the sacrificial layer to the material of the shallow trench isolations will be selected. In this embodiment, since the shallow trench isolations are preferably of silicon oxide, and the sacrificial layer is preferably of silicon nitride, it is necessary to select to use the silicon nitride to dry etch a device having an OX high selection ratio, so that the etching is easily stopped on the silicon oxide of the STI. It can be seen from the AA' direction that portions of the sacrificial layer on the active region corresponding to the drain of the memory are not removed, this is because the method provided in the present disclosure is a reverse through-hole process, that is, forming the sacrificial layer at positions corresponding to actual through-holes; removing portions of the sacrificial layer in regions other than the actual through-holes; and depositing an isolation dielectric in space formed after removing the portions of the sacrificial layer, and then reserving the isolation dielectric at the reverse through-holes in the process of removing the remaining sacrificial layer; and not depositing dielectric at the reverse through-holes in the step of depositing the dielectric into the through-holes to form contact holes. FIG. 7C shows a sectional view of the semiconductor structure in a BB' direction, and in the BB' direction, a schematic diagram of the gates in the second direction is shown. FIG. 7D shows a sectional view of the semiconductor structure in a CC' direction, and in the CC' direction, a schematic diagram of the gates in the shallow trench isolations 311 and in the first direction is shown. It can be seen from the CC' direction that the portions of the sacrificial layer corresponding to the drain of the memory on the STI are removed, reserving through-hole spaces for the subsequent formation of the reverse through-holes.

After removing the portions of the sacrificial layer corresponding to the drain of the memory on the shallow trench isolations, the method provided in the present disclosure further comprises: depositing the isolation dielectric in the through-hole spaces formed after removing the portions of the sacrificial layer, so as to form isolation strips 351, and the positions of the above isolation strips 351 are exactly opposite to the positions of the through-holes, and therefore the above isolation strips 351 can be defined as the reverse through-holes 350. FIGS. 8A-8D show the schematic diagrams of the semiconductor structure after the above steps are executed. FIG. 8B shows a sectional view of the semiconductor structure in an AA' direction, and in the AA' direction, a schematic diagram of the gates in the active regions and in the first direction is shown. FIG. 8C shows a sectional view of the semiconductor structure in a BB' direction, and in the BB' direction, a schematic diagram of the gates in the second direction is shown. FIG. 8D shows a sectional view of the semiconductor structure in a CC' direction, and in the CC' direction, a schematic diagram of the gates in the shallow trench isolations 311 and in the first direction is shown. It can be seen from the CC' direction that the spaces on the STI where the sacrificial layer corresponding to the drain of the memory is removed is filled with the isolation dielectric to form the isolation strips 351. In one embodiment, the material of the isolation strip 351 is silicon oxide, and the silicon oxide is selected to be used as the isolation dielectric, which is different from the material, silicon nitride, of the sacrificial layer in this embodiment. Therefore, in the subsequent removal of the sacrificial layer, the selection of an appropriate reagent may bring no damage to the isolation strips 351 during the process of removing the sacrificial layer.

The semiconductor device manufactured using the manufacturing method provided in the present disclosure is an ETOX memory, and the ETOX memory further comprises a peripheral circuit in addition to the memory cell region as described above. In the case where the above isolation strips have been formed, the memory cell region is protected by a mask layer, thereby performing the processing of the peripheral circuit. Specifically, the processing of the peripheral circuit involves: lithography for the peripheral circuit, removing the mask layer on the peripheral circuit POLY by means of dry etching or the combination of dry and wet etching, peripheral circuit field gate lithography, dry etching, stopping on the bottom interlayer insulating oxide layer, peripheral circuit LDD lithography, peripheral circuit LDD ion implantation, and rapid annealing; the spacer growth of the peripheral circuit, the spacer dry etching stopping on a tunnel oxide layer, and growing a second layer spacer, and the second layer spacer dry etching, the peripheral circuit source-drain lithography, the peripheral circuit source-drain ion implantation, rapid annealing and oxide deposition, SAB lithography, deposition of nickel by SAB dry and wet etching, rapid annealing, selective removal of unreacted nickel, CVD silicon nitride deposition, ILD HARP silicon oxide deposition and the process of ILD mechanical grinding. In some embodiments, the above processing of the peripheral circuit can be performed by using the existing or future peripheral circuit process according to actual requirements, and is not limited to the above examples.

Since the size of the semiconductor device is reduced, the memory cell region and the peripheral circuit region cannot be processed at the same time, and therefore when a series of processing is performed on the peripheral circuit, the device in the memory cell region is protected by the hard mask layer until the peripheral circuit is processed.

Figure 9A:
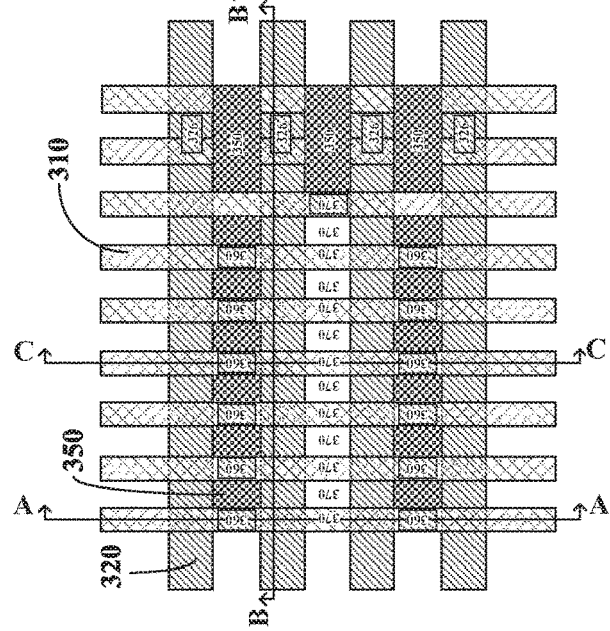
Figure 9B:
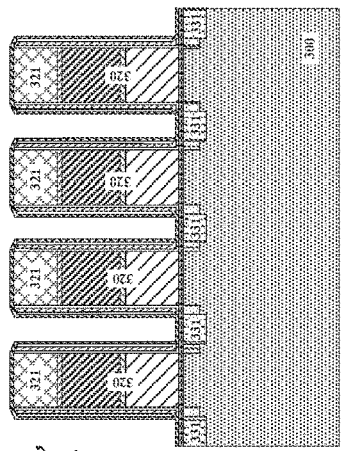
Figure 9C:
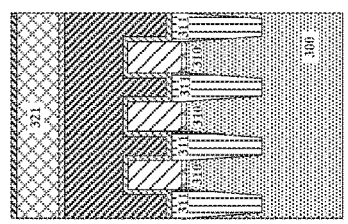
Figure 9D:
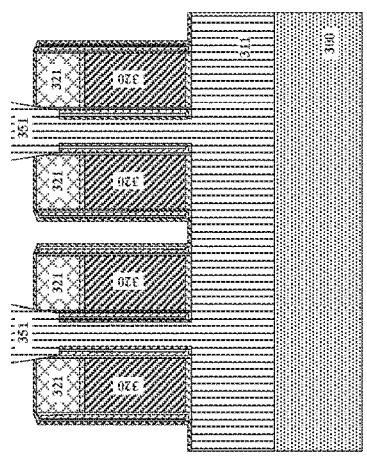

As stated above, after the step of forming the isolation strips 351 and after the processing of the peripheral circuit, the method provided in the present disclosure further comprises: removing the remaining sacrificial layer 340 to form the through-holes. FIGS. 9A-9D show the schematic diagrams of the semiconductor structure after the above steps are executed. Specifically, as shown in the design drawing of the layout of FIG. 9A, the through-holes comprise drain through-holes 360 located in the active regions 310, source through-holes 370 located on the active regions 310 and the shallow trench isolation regions, and gate through-holes 326 located above the gates. FIG. 9B shows a sectional view of the semiconductor structure in an AA' direction, and in the AA' direction, a schematic diagram of the gates in the active regions and in the first direction is shown. As shown in FIG. 9B, the portions of the sacrificial layer on the active regions corresponding to the source through-holes 370 and the drain through-holes 360 are both removed. FIG. 7D shows a sectional view of the semiconductor structure in a CC' direction, and in the CC' direction, a schematic diagram of the gates in the shallow trench isolations 311 and in the first direction is shown. It can be seen from the CC' direction that the portions of the sacrificial layer corresponding to the source through-holes 370 of the memory on the STI are removed, and portions on the STI corresponding to the drain through-holes 360 of the memory are the isolation strips 351 formed in the previous step. As stated above, since the material of the isolation strips 351 is preferably silicon oxide that is different from the material of the sacrificial layer, silicon nitride, in this step, an approach of wet etching is employed; and since the silicon nitride has a high selection ratio to the silicon oxide during wet etching, the regions of the isolation strips 351 will not be etched.

By means of the above steps, the through-holes at the drain and the source of the memory region have been formed. According to the method provided in the present disclosure, it can be seen that the through-holes at the source and drain continue to be of the straight shape of the control gates, and the method provided in the present disclosure avoids the problem of the through-hole OVL offset compared to directly punching through-holes in an interlayer medium by means of lithography and etching, and the manufacturing method provided in the present disclosure is further applicable to the field having a small node size, has a wide application range, and good performance of the manufactured semiconductor device.

Although the through-holes at the source and drain of the memory region have been formed, the method provided in the present disclosure further comprises: forming the through-hole of the gate of the memory region, and FIGS. 10A-10D show schematic diagrams of the semiconductor structure after the above steps are executed. As shown in the design drawing of the layout of FIG. 10A, the through-holes further comprise the gate through-holes 326 located above the gates. To form the above gate through-holes 326, specifically, photoresist 380 is deposited on the memory cell region, and then the photoresist 380 is patterned to define a region of the gate through-hole 326 and expose portions of a top barrier layer 321 corresponding to the gate through-holes 326. The exposed portions of the barrier layer 321 are removed by means of dry etching, thereby comprising the gates 320 forming the gate through-holes. FIG. 10B shows a sectional view of the semiconductor structure in an AA' direction, and in the AA' direction, a schematic diagram of the gates in the active region and in the first direction is shown. FIG. 10D shows a sectional view of the semiconductor structure in a CC' direction, and in the CC' direction, a schematic diagram of the gates in the shallow trench isolations 311 and in the first direction is shown, and therefore it can be seen that the photoresist 380 is deposited in the entire memory region. FIG. 10C shows a sectional view of the semiconductor structure in a BB' direction, and in the BB' direction, a schematic diagram of the gates in the second direction is shown. It can be seen from the BB' direction that the photoresist 380 is deposited on the surface of the top barrier layer 321 on the gate 320, and the photoresist corresponding to the gate through-hole regions is removed, exposing the top barrier layer 321 corresponding to the gate through-hole region, and removing the portions of the top barrier layer 321 corresponding to the gate through-hole regions by means of etching, so as to form the gate through-holes.

In the above step of forming the gate through-holes, since silicon nitride is preferably the material of the sacrificial layer in this embodiment, the barrier layer on the gates uses the material of silicon nitride/silicon oxide, and has the same film structure as the gates on the peripheral circuit. Therefore, it is also possible to simultaneously process the through-holes on the peripheral circuits while processing the memory cell gate through-holes. By forming the memory cell gate through-holes and the peripheral circuit through-holes with the same mask, an additional mask can be saved. If silicon oxide is selected as the material of the sacrificial layer, the barrier layer on the corresponding gates of memory cell uses the structure of silicon nitride or silicon oxide/silicon nitride, and has a different film structure from that of the peripheral circuit. Therefore, processing of the gate through-holes of the memory cell region and processing of the through-holes of the peripheral circuit may necessitate two masks to be completed in two steps, thus greatly improving the manufacturing cost.

After the unnecessary photoresist 380 is removed through the above steps, the through-holes of the source, drain and gate of the memory cell have already been formed. FIGS. 11A-11D show schematic diagrams of the deposition of a conductive medium in the above formed through-holes so that the through-holes becomes contact holes. As shown in the design drawing of the layout of FIG. 11A, the source through-holes are located on the active regions and the STI, and therefore after depositing the conductive medium, the source through-holes at the bottom form source bottom contact holes 372 of a common source, and are led out through the source top through-holes 371 subsequent to the step of forming the top through-hole. FIG. 11B shows a sectional view of the semiconductor structure in an AA' direction, and in the AA' direction, a schematic diagram of the gates in the active regions and in the first direction is shown. It can be seen that the source through-holes and the drain through-holes located on the active regions are deposited with a conductive medium to become source bottom contact holes and drain bottom contact holes. FIG. 11C shows a sectional view of the semiconductor structure in a BB' direction, and in the BB' direction, a schematic diagram of the gates in the second direction is shown. It can be seen from the BB' direction that the conductive medium is deposited at the gate through-holes to form the gate bottom contact holes. FIG. 11D shows a sectional view of the semiconductor structure in a CC' direction, and in the CC' direction, a schematic diagram of the gates in the shallow trench isolations 311 and in the first direction is shown. Since there are only source through-holes on the STI, the conductive medium is deposited on the source through-holed, and the isolation strips 351 formed by the pre-process correspond to the drain of the memory.

Since the contact holes function to lead out the source, drain and gate of the memory and the peripheral circuit, the contact hole has a great height at practice, and if they are combined to form a layer of through-holes, the height is too great, and it is easy to etch incompletely in the pre-process or etch excessively, resulting in the bottom silicon to lose too much. Therefore, the method provided in the present disclosure divides the contact hole into two segments, and the above process has already formed the bottom through-holes, and a manufacturing method for top through-holes will be specifically described below.

As shown in FIGS. 12A-12D, a top isolation layer 400 is deposited on a memory cell region in which a bottom contact hole has been formed. FIG. 12A shows a design drawing of the layout of the memory device. FIG. 12B shows a sectional view of the semiconductor structure in an AA' direction, and in the AA' direction, a schematic diagram of the gates in the active regions and in the first direction is shown. FIG. 12C shows a sectional view of the semiconductor structure in a BB' direction, and in the BB' direction, a schematic diagram of the gates in the second direction is shown. FIG. 12D shows a sectional view of the semiconductor structure in a CC' direction, and in the CC' direction, a schematic diagram of the gates in the shallow trench isolations 311 and in the first direction is shown, which can be seen that a top isolation layer 400 is deposited on the surface of the entire memory region. Specifically, the material of the top isolation layer 400 may be silicon oxide (including, but not limited to ILD PEOX)/silicon nitride (including, but not limited to ILD silicon nitride)/silicon oxide (including, but not limited to ILD PETOES), and mechanical grinding is performed. When the top isolation layer 400 uses a multi-layer structure, and the materials of various layers are different, and when the through-holes are subsequently etched, the layers can be used as different etching stop layers, and dividing the etching into several steps can make the etching of the through-holes more accurate and ensure that the profile meets the requirements.

As shown in FIGS. 13A-13D, top through-holed are formed in the top isolation layer 400 that has been formed, and the top through-holes comprise top gate through-holes corresponding to the gate through-holes 326, source top through-holes 371 leading out the source bottom contact holes 372, and drain top through-holes corresponding to the drain through-holes 360. FIG. 13B shows a sectional view of the semiconductor structure in an AA' direction, and in the AA' direction, a schematic diagram of the gates in the active regions and in the first direction is shown. It can be seen that the drain top through-holes are formed in the top isolation layer 400. Since the source top through-holes only correspond to some of the source bottom through-holes, the source top through-holes are not shown in FIG. 13B. FIG. 13C shows a sectional view of the semiconductor structure in a BB' direction, and in the BB' direction, a schematic diagram of the gates in the second direction is shown. The figure shows gate top through-holes corresponding to the gate bottom contact holes. FIG. 13D shows a sectional view of the semiconductor structure in a CC' direction, and in the CC' direction, a schematic diagram of the gates in the shallow trench isolations 311 and in the first direction is shown, and in the CC' direction, the source bottom contact holes at the STI are shown. Since the source top through-holes only correspond to some of the source bottom through-holes, the source top through-holes are not shown in FIG. 13D.

As shown in FIGS. 14A-14D, a conductive medium is deposited in the top through-holes, so that the conductive medium in the top through-holes is in physical conduction with the conductive medium in the bottom through-holes. In one embodiment, the above conductive medium is Ti/TiN/W, and mechanical grinding is performed after depositing the conductive medium.

So far, a detailed flow of the manufacturing method provided in the present disclosure has been described in detail. Since the size of AA/CG is reduced to 45 nm and below, the spacers of the peripheral circuit and the spacers of the memory region cannot be performed simultaneously, otherwise the spacers of the peripheral circuit will directly fill the memory cell regions; therefore, in the present disclosure, the memory region and the peripheral circuit region are separately performed. A method of depositing two isolation dielectrics on the spacers of the gate serves as a gate protection barrier layer when the sacrificial layer is removed in a subsequent process. By means of reverse through-hole lithography RCT photo (Reverse CT), dry etching (SIN is used to dry etch the gas of an OX high selection ratio and stop on STI OX); and silicon nitride is used as the sacrificial layer, and since the material of the silicon nitride is different from that of the silicon oxide of STI, which is easy to stop on the STI while reversing the through-hole dry etching. The conventional through-hole process is to directly punch holes on the AA, and the reverse through-hole process is to first make isolation strips on the STI, and then through-hole regions between the isolation strips are automatically formed.

In the step of lithography of memory cell region (reusing the Cell VT mask), the wet etching removes the silicon nitride on the drain active regions AA and the source (AA/STI) of the memory cell region, and the isolation region will not be etched because the silicon oxide is used as the isolation layer on the drain non-inactive region STI and the silicon nitride has a high selection ratio to the silicon oxide during wet etching.

The top through-hole lithography (including the top through-holes in the memory cell region and the peripheral circuit region) and the bottom through-holes share the same mask and are dry etched. The bottoms of the source are connected by W to form a common source, and the connection line is led out by the top through-hole connection.

The implementation of nodes of the ETOX structure of 45 nm and below is achieved by a reverse through-hole process using silicon nitride as the sacrificial layer. One of the advantages of the reverse through-hole process is that the through-hole continues to be of the shape of the control gate, which is more straight than the shape of through-hole compared with conventional process. The second advantage is that there is no longitudinal OVL shift problem, which greatly reduces the risk of leakage or breakdown from the drain to the control gate.

The present disclosure further provides a semiconductor structure manufactured using the above manufacturing method, and the semiconductor structure manufactured using the above manufacturing method is more excellent in electrical characteristics of the memory.

Thus, the embodiment of the manufacturing method for the semiconductor device configured for forming a through-hole and the manufactured semiconductor structure has been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments may necessitate more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A manufacturing method for a semiconductor device, configured for forming through-holes in the semiconductor device, wherein the semiconductor device comprises memory cell regions, the manufacturing method comprising:
    providing a substrate;
    forming a plurality of shallow trench isolations in portions of the substrate corresponding to the memory cell regions, wherein the shallow trench isolations are arranged spaced apart from each other in a first direction and extend in a second direction to define active regions of the substrate which are spaced apart by the shallow trench isolations, the first direction being perpendicular to the second direction;
    forming a plurality of gates on surfaces of the portions of the substrate, wherein the gates extend in the first direction and are arranged spaced apart from each other in the second direction;
    forming spacers on side walls at both sides of the gates extending in the first direction;
    depositing a sacrificial layer on the memory cell region, wherein the sacrificial layer covers the gates and fills gaps between the gates;
    removing portions of the sacrificial layer corresponding to the shallow trench isolations at memory cell drain, and depositing an isolation dielectric on the shallow trench isolations at the memory cell drain to form isolation strips; and
    removing the remaining sacrificial layer to form bottom through-holes in spaces formed after removing the remaining sacrificial layer, wherein the bottom through-holes comprise drain bottom through-holes of the active regions corresponding to the memory cell drain and source bottom through-holes corresponding to memory cell source;
    wherein a material of the sacrificial layer is different from the materials of the spacers, the isolation dielectric, and the shallow trench isolations.

2. The manufacturing method of claim 1 wherein the gates comprise a control gate layer and a top barrier layer on an upper surface of the control gate layer; and
    the step of forming the bottom through-holes further comprises: after removing the remaining sacrificial layer, removing portions of the top barrier layer corresponding to gate through-hole regions to form gate bottom through-holes.

3. The manufacturing method of claim 2, wherein the method for forming the gate bottom through-holes further comprises:
    depositing photoresist on the memory cell regions;
    patterning the photoresist to define the gate through-hole regions and exposing the portions of the top barrier layer corresponding to the gate through-hole regions;
    performing dry etching to remove the portions of the top barrier layer corresponding to the gate through-hole regions to form the gate bottom through-holes; and
    removing the photoresist.

4. The manufacturing method of claim 2, wherein the manufacturing method further comprises: forming a top isolation layer on upper surfaces of the gates; and
    forming top through-holes, which communicate with the bottom through-holes, in the top isolation layer.

5. The manufacturing method of claim 4, wherein the step of forming the top through-holes further comprises: depositing photoresist on a surface of the top isolation layer;
    patterning the photoresist to define top through-hole regions and exposing portions of the top isolation layer corresponding to the top through-hole regions;
    performing dry etching to remove the portions of the top isolation layer corresponding to the top through-hole regions to form the top through-holes; and removing the photoresist, wherein
    the top through-hole regions comprise drain top through-hole regions, source top through-hole regions, and gate top through-hole regions;
    the drain top through-hole regions correspond to the drain bottom through-holes on a one-to-one basis;
    the source top through-hole regions correspond to some of the source bottom through-holes; and
    the gate top through-hole regions correspond to the gate bottom through-holes on a one-to-one basis.

6. The manufacturing method of claim 4, further comprising, before forming the top isolation layer: depositing conductive mediums in the bottom through-holes to form bottom contact holes, wherein upper surfaces of the bottom contact holes are flush with the upper surfaces of the gates; and the top isolation layer is formed on the upper surfaces of the bottom contact hole and of the gate.

7. The manufacturing method of claim 6, wherein the manufacturing method further comprises: depositing conductive mediums in the top through-holes to form top contact holes, wherein the top contact holes are electrically connected to the bottom contact holes.

8. The manufacturing method of claim 2, wherein the material of the sacrificial layer is one of silicon oxide or silicon nitride.

9. The manufacturing method of claim 8, wherein the material of the sacrificial layer is silicon nitride, and the material of the spacers, the isolation dielectric, and the shallow trench isolations is silicon oxide.

10. The manufacturing method of claim 9, wherein the semiconductor device further comprises peripheral circuit regions, and the manufacturing method further comprises:
    forming MOS transistor devices on portions of the substrate corresponding to the peripheral circuit regions, and
    forming peripheral circuit through-holes to lead out a source, a drain, and a gate of the MOS transistor device, wherein the gate bottom through-holes and the peripheral circuit through-holes are simultaneously formed.

11. A semiconductor device, wherein the semiconductor device is manufactured using a method comprising:
    forming a plurality of shallow trench isolations in portions of a substrate corresponding to the memory cell regions, wherein the shallow trench isolations are arranged spaced apart from each other in a first direction and extend in a second direction to define active regions of the substrate which are spaced apart by the shallow trench isolations, the first direction being perpendicular to the second direction;
    forming a plurality of gates on surfaces of the portions of the substrate, wherein the gates extend in the first direction and are arranged spaced apart from each other in the second direction;
    forming spacers on side walls at both sides of the gates extending in the first direction;
    depositing a sacrificial layer on the memory cell region, wherein the sacrificial layer covers the gates and fills gaps between the gates;
    removing portions of the sacrificial layer corresponding to the shallow trench isolations at memory cell drain, and depositing an isolation dielectric on the shallow trench isolations at the memory cell drain to form isolation strips; and
    removing the remaining sacrificial layer to form bottom through-holes in spaces formed after removing the remaining sacrificial layer, wherein the bottom through-holes comprise drain bottom through-holes of the active regions corresponding to the memory cell drain, source bottom through-holes corresponding to memory cell source, and gate bottom through-holes corresponding to memory cell gate; and
    wherein a material of the sacrificial layer is different from the materials of the spacers, the isolation dielectric, and the shallow trench isolations.

* * * * *